United States Patent

Andreev et al.

(10) Patent No.: US 8,245,168 B2
(45) Date of Patent: Aug. 14, 2012

(54) METHOD AND APPARATUS FOR GENERATING MEMORY MODELS AND TIMING DATABASE

(75) Inventors: Alexandre Andreev, San Jose, CA (US); Andrey Nikitin, Moscow (RU); Ranko Scepanovic, Saratoga, CA (US); Igor A. Vikhliantsev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 337 days.

(21) Appl. No.: 12/508,320

(22) Filed: Jul. 23, 2009

(65) Prior Publication Data

US 2010/0023904 A1    Jan. 28, 2010

Related U.S. Application Data

(62) Division of application No. 11/298,894, filed on Dec. 9, 2005, now Pat. No. 7,584,442.

(51) Int. Cl.
*G06F 17/50* (2006.01)
(52) U.S. Cl. ......................................... 716/113; 716/108
(58) Field of Classification Search .................. 716/108, 716/113
See application file for complete search history.

(56) References Cited

U.S. PATENT DOCUMENTS

| | | | |
|---|---|---|---|
| 5,883,814 A | 3/1999 | Luk et al. | |
| 6,389,379 B1 | 5/2002 | Lin et al. | |
| 6,532,576 B1 | 3/2003 | Mbouombouo et al. | |
| 6,609,236 B2 * | 8/2003 | Watanabe et al. | 716/119 |
| 6,643,758 B2 | 11/2003 | Furuyama et al. | |
| 6,651,225 B1 | 11/2003 | Lin et al. | |
| 6,738,953 B1 | 5/2004 | Sabharwal et al. | |
| 6,760,899 B1 | 7/2004 | Young et al. | |
| 6,820,048 B1 * | 11/2004 | Bhutani et al. | 703/15 |
| 6,891,395 B2 | 5/2005 | Wells et al. | |
| 6,959,428 B2 | 10/2005 | Broberg, III et al. | |
| 7,055,113 B2 | 5/2006 | Broberg, III et al. | |
| 7,124,391 B1 | 10/2006 | Patterson | |
| 7,181,710 B2 | 2/2007 | Wright et al. | |
| 7,185,301 B2 | 2/2007 | Hao et al. | |
| 7,200,826 B2 | 4/2007 | Andreev et al. | |
| 7,216,319 B1 | 5/2007 | Yau et al. | |
| 7,224,181 B1 | 5/2007 | Schmit et al. | |
| 7,389,484 B2 | 6/2008 | Andreev et al. | |
| 7,424,687 B2 | 9/2008 | Andreev et al. | |
| 2007/0028199 A1 * | 2/2007 | Bhutani et al. | 716/6 |

OTHER PUBLICATIONS

Office Action Requirement for Restriction/Election from U.S. Appl. No. 11/298,894, dated Apr. 20, 2007.
Non-Final Office Action from U.S. Appl. No. 11/298,894, dated Jun. 26, 2007.
Non-Final Office Action from U.S. Appl. No. 11/298,894, dated Dec. 21, 2007.
Non-Final Office Action from U.S. Appl. No. 11/298,894, dated Jul. 11, 2008.
Final Office Action from U.S. Appl. No. 11/298,894, dated Feb. 20, 2009.

* cited by examiner

*Primary Examiner* — Jack Chiang
*Assistant Examiner* — Patrick Sandoval
(74) *Attorney, Agent, or Firm* — David D. Brush; Westman, Champlin & Kelly, P.A.

(57) ABSTRACT

A method and apparatus are provided for creating and using a memory timing database. A plurality of characterization memories are defined, which can be mapped to a memory resource. Each characterization memory has different memory parameters. A plurality of variants of tiling each characterization memory to the memory resource are also defined. Timing characteristics of each tiling variant of each characterization memory are stored in the memory timing database for the memory resource based on sets of input ramptimes and output loads.

11 Claims, 6 Drawing Sheets

METHOD AND APPARATUS FOR GENERATING MEMORY MODELS AND TIMING DATABASE

CROSS-REFERENCE TO RELATED APPLICATION

The present application is a divisional of and claims priority from U.S. patent application Ser. No. 11/298,894, filed Dec. 9, 2005, the content of which is hereby incorporated by reference in its entirety.

FIELD OF THE DISCLOSURE

The present disclosure relates to semiconductor integrated circuits. More particularly, the present disclosure relates to timing analysis of memories mapped to an integrated circuit layout pattern.

BACKGROUND

In the design of integrated circuits, memory devices in a customer design are mapped to memory resources on an integrated circuit layout pattern. Depending on the technology, there may be a large number of different ways in which the memory can be mapped or "tiled" to the memory resources.

It is customary for the integrated circuit manufacturer to provide the customer with various tools and models for assisting the customer in designing or customizing an integrated circuit for a particular application. Some integrated circuits have several different types of memory resources and can include large arrays of memory elements. Since the customer memory often can be mapped to the memory resources in a variety of different ways, the process of generating a timing model of the customer memory for a particular mapping can be come very difficult and may require design tools that process large amounts of data and have long processing times.

Processes and apparatus are therefore desired for generating memory timing models in an efficient manner.

SUMMARY

An embodiment of the present invention is directed to a method including: (a) defining a plurality of characterization memories, which can be mapped to a memory resource, each characterization memory having different memory parameters; (b) defining a plurality of variants of tiling each characterization memory to the memory resource are also defined; and (c) storing timing characteristics of each tiling variant of each characterization memory in the memory timing database for the memory resource based on sets of input ramptimes and output loads.

Another embodiment of the present invention is directed to a method including: (a) accessing a timing database for a set of characterization memories that can be mapped to a memory resource, each characterization memory having different memory parameters, the timing database comprising timing characteristics for each of a plurality of variants of tiling each of the characterization memories to the memory resource; (b) comparing memory parameters of design memory having a known tiling variant with those of the characterization memories to identify a corresponding characterization memory; and (c) assigning the timing characteristics of the known tiling variant of the corresponding characterization memory to the design memory.

Another embodiment of the present invention is directed to a memory timing database. The database includes timing characteristics for each triple (MEM, Memory Resource, tiling_variant), wherein Memory Resource is a memory resource to which a design memory can be mapped, MEM is a memory of a set of characterization memories having different memory parameters and capable of being mapped to the Memory Resource, and tiling_variant is a variant of tiling MEM to Memory Resource.

DETAILED DESCRIPTION OF ILLUSTRATIVE EMBODIMENTS

Figure 1:
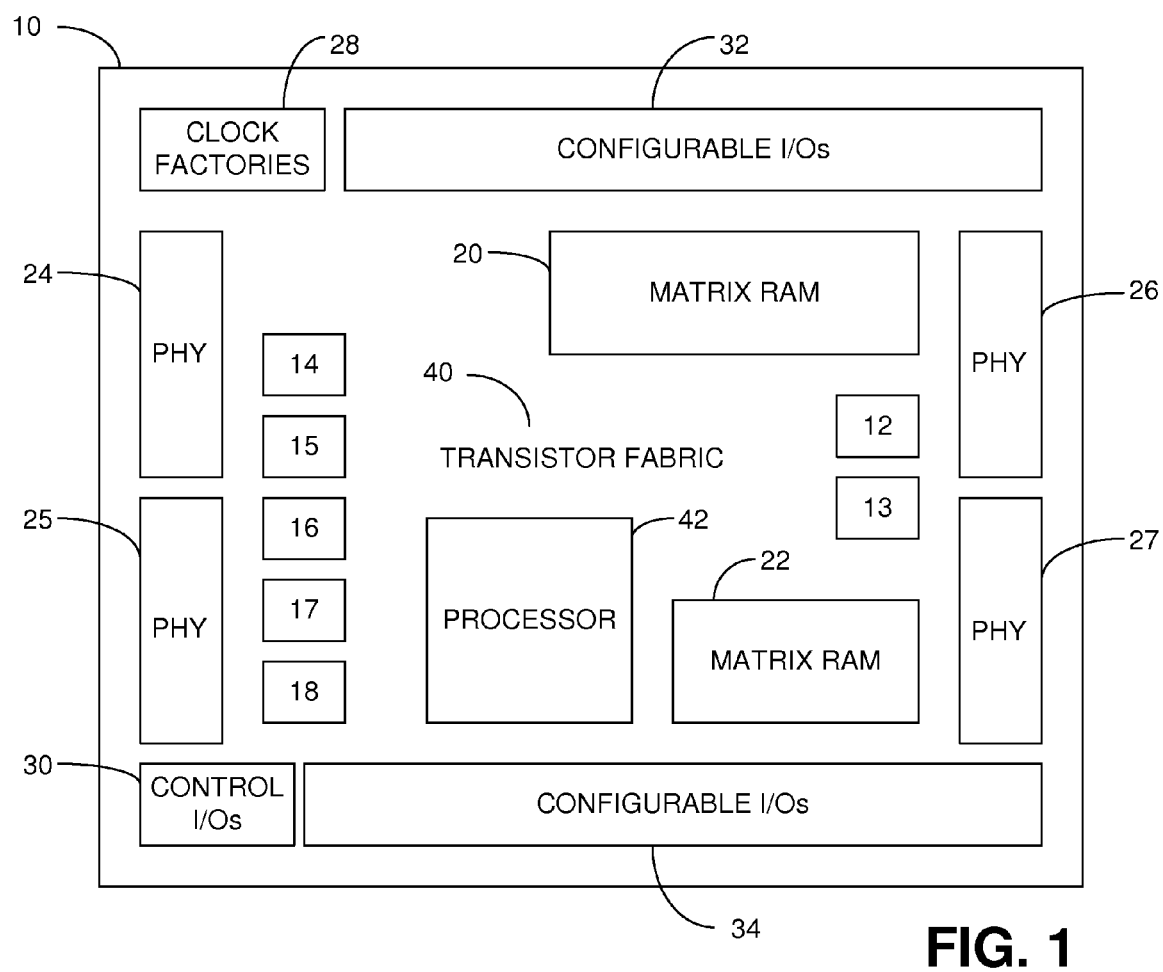
FIG. 1 is a simplified, schematic block diagram of a semiconductor slice.

Integrated circuits are generally fabricated on a thin silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for patterning features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilicon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

1. Customizable Integrated Circuits

One or more embodiments of the present invention can be used with integrated circuits in which the features of the integrated circuit are pre-defined by the manufacturer, fully customizable or partly customizable. Several recent types of integrated circuits have been developed that have modules or blocks of transistors that are partly fixed and partly programmable and/or customizable. The utility of these modular chips is determined by factors such as complexity, cost, time, and design constraints to create functional electronics from these generic blocks of transistors. Field Programmable Gate Array (FPGA) refers to a type of logic chip in which all mask layers are pre-fabricated by an ASIC vendor and has a function that can be easily reprogrammed in the field with trivial modifications. FPGAs, however, are very large and have relatively high cost per function, relatively low speed, and high power consumption. An application specific integrated circuit (ASIC) is an integrated circuit designed specifically for a particular application or use. In a fully programmable ASIC, all mask layers are programmed or customized by the logic designer. A typical example of a fully programmable ASIC is a cell-based ASIC (CBIC). While a fully programmable ASIC efficiently uses power and area as compared to FPGAs, it is very complex to design and prototype. In a semi-programmable ASIC, some, but not all, mask layers are programmable. For example, some or all of the base layers are pre-fabricated by the ASIC vendor and the remaining layers, such as the metal layers, are programmed by the logic designer to interconnect the semiconductor elements to perform the desired function. A typical example of a semi-programmable ASIC is a gate-array-based ASIC. A semi-programmable ASIC can combine the high-density, high-performance benefits of standard-cell ASICs with the fast time-to-market and customization benefits of FPGAs.

Accordingly, semi-programmable ASICs have recently become more popular. Integrated circuit foundries have begun to develop standard, or base, platforms, known as "slices" comprising the base layers of an integrated circuit but without the metal interconnection layers. The base layers are patterned to form gates that can be configured into cells using tools supplied by the foundry. The chip designer designs additional metal layers for the base platform to thereby configure the integrated circuit into a custom ASIC employing the customer's intellectual property. An example of such configurable base platform is the RapidChip® Platform available from LSI Logic Corporation of Milpitas, Calif. The RapidChip® platform permits the development of complex, high-density ASICs with significantly reduced design and manufacturing risks and costs.

The design effort for a semi-programmable integrated circuit encompasses several stages. After the chip size has been selected and the input-output (I/O) cells have been placed in a layout pattern for the base platform, megacells, including memories and other large hard macros (hardmacs), are placed. Thereafter, standard cells are placed to complete the chip design.

An embodiment of the present invention is directed to a method and apparatus for generating timing models for customer memories (or other functional blocks) that are mapped to an integrated circuit layout pattern, such as the layout pattern of an integrated circuit having modules or blocks of transistors that are partly fixed and partly programmable and/or customizable. For example, a base platform for an integrated circuit can include Reconfigurable RAM, or RRAM for short. RRAM includes sets of memories of the same type that are placed compactly within a memory matrix. An RRAM, as the term is used herein, is a megacell that can be considered as a set of memories with built-in self-testing and built-in self correction. The base platform might also contain single diffused memories, rcell memories and/or flip-flop rcell memories defined within the transistor fabric of the base platform, for example.

Single-diffused memories are memories that are pre-diffused on the base platform slice. For example, a base platform can include arrays of fixed random access memory (RAM). Each RAM instance is self-contained and can have its own built-in self-test (BIST) circuitry, decoupling capacitances and hard macro that snaps to locations in the layout floorplan. In some base platforms, RAM resources are consolidated in a number of small regions called RRAM matrices to share overhead and reduce area wastage. An example of a memory matrix is described in U.S. application Ser. No. 10/875,128, filed Jun. 23, 2004 and entitled YIELD DRIVEN MEMORY PLACEMENT SYSTEM, and U.S. Pat. No. 6,084,811 entitled PROCESS FOR LAYOUT OF MEMORY MATRICES IN INTEGRATED CIRCUITS.

An rcell is a basic unit within the transistor fabric. An rcell is made up of "N" and "P" type transistors. rcells are generally diffused in a regular pattern throughout the slice and are arranged to implement efficiently both memory and logic structures. The rcells are configured by interconnecting the various components through multiple layers of metal to allow for the creation of logic functions.

Flip-flop rcell memories are memories that are built from flip-flops and logical cells. Flip-flop rcell memories are often used for mapping memories having a very small number of words. Other memory types can also be used in alternative embodiments.

2. Example of a Base Platform Slice

FIG. 1 is a diagram, which schematically illustrates a layout pattern for a base platform slice 10 of a partially manufactured semiconductor device on which the base wafer layers up to the connectivity layers have been fabricated. Slice 10 includes a base semiconductor wafer onto which hardmacs and other semiconductor devices have been diffused into the semiconductor layers. Diffusing a semiconductor wafer to create a hardmac simply means that during fabrication of the wafer layers, transistors or other electronic devices have been particularly and permanently embedded or otherwise arranged in the wafer layers to achieve specific functions, such as single diffused memories 12-18, RRAM matrices 20 and 22, data transceiver hardware such as I/O PHYs 24-27, clock factories including phase locked loops (PLLs) or delay locked loops (DLLs) 28, control I/Os 30, and configurable input/output (I/O) hardmacs 32 and 34.

The slice further includes a gate array of transistors, called transistor fabric 40, for further development. Transistor fabric 40 is an array of prediffused transistors in a regular pattern that can be logically configured by configuring the metal layers interconnecting the transistors by a suite of generation tools. For example, the tools may be used place one or more, and typically thousands, of cells onto the transistor fabric from a cell library. A cell refers to the personalization of the interconnect layers that instantiate a logic gate of the transistor fabric. For example, rcell memories and/or rcell flip-flop memories can be instantiated within the transistor fabric 40. A typical slice 10 also includes an embedded processor 42 that may be connected to other components of the slice.

The slice definition thus is a detailed listing of all the features available on the slice, such as the available transistor fabric and memory, a specification of a processor, processing element or processing circuit, the available configurable and/or hardmac I/O, an internal bus specification, any requirements of the available features, the cost of the slice, the ideal performance that can be expected of the slice, the expected power consumption, and other functional requirements, for example. The base platform for slice 10 may also include the contact mask and some of the fixed higher layers of connectivity for distribution of power, ground, and external signal I/O.

The slice 10 shown in FIG. 1 is only one example of a slice and its components. Other sets of features can be diffused into the base layers in alternative embodiments of the present invention. Different slices may contain different amounts of transistor fabric, different amounts and types of diffused and/ or compiled memories, different types of fixed and configurable I/O blocks, different types and amounts of I/O hardmacs, processors, clocks, etc., depending upon the purpose of the final integrated circuit.

The slice itself can be defined by register transfer logic (RTL) or a netlist, for example. The collection of RTL logic is categorized into "shells" and can include a documentation shell, a verification shell, a synthesis shell, a static timing analysis shell, and a manufacturing test shell, all of which provide input and/or contain output from one or more of the design tools. The RTL shell provides a logical description of an aspect of the slice or of the generated or used resources. The documentation shell may be considered as the functional description of the resources. The verification shell is the functional verification description, whereas the synthesis shell may be thought of as the generation description. The static timing analysis shell is the timing description, the manufacturing test shell is the test description, and the floorplan shell is a description of the location of the slice resources. Additional shells may include a floorplan shell and an RTL qualification shell.

Memory placement can be performed automatically by a placement tool or manually by the designer. As mentioned above, customer memories can be mapped to RRAMs, SDMs, rcell memories and flip-flop rcell memories, for example. For example, a given customer (design) memory can be mapped to RRAM 20 or 22. Within a given RRAM 20 or 22, depending on the capacity and width of the customer memory and that of the RRAM, the customer memory typically can be mapped to a variety of different locations (rows/ columns of leaf cells) in the RRAM. Also, the customer memory can be tiled within the leaf cells in a variety of different ways. For example, the capacity and width of the customer memory can be reconfigured and/or the customer memory can be split into two or more memory portions to better fit the rows and columns of the RRAM or other memory resource to which the customer memory is mapped.

3. Memory Timing Database and Memory Timing Models
   a. Large Amount of Data/Processing Time Since any given customer memory can be mapped in different ways to a selected instance of a given memory type (such as different locations within an RRAM matrix) or to different memory types on the base platform slice, the process of generating timing models for a customer memory can become difficult and can include the analysis of a very large amount of data. This is particularly true for customer memories that are mapped to locations within an RRAM memory or other matrix memory.

An RRAM has a very complicated structure that is often hidden from the customer. When a particular customer memory is mapped to a particular RRAM on the base platform slice, there are two different points of view of the memory. From the customer point of view, the memory has a clear outline and a defined timing model including I/O path delays, interconnect delays, setup and hold times, pin capacitance's, etc. From the manufacturer point of view, generating the timing models for a particular mapping of the customer memory to a memory resource on the integrated circuit can be a difficult and time-consuming task.

For example, a customer memory that has been mapped to RRAM is defined by a complicated netlist (referred to as a "tiling netlist") that includes a list of inputs and outputs of the memory, all cells in the memory, and their respective electrical interconnections. The cells of an RRAM memory can include base memories of the RRAM, flip-flops and logical memories. The tiling netlist highly depends on the particular RRAM and on the location inside that RRAM to which the customer memory is mapped.

Usually, a tiling netlist has tens of clock pins and thousands of data input and output pins. For each pair (clock pin, data input pin), the timing analysis tools evaluate the setup and hold times, if that data input pin depends on the clock pin. For each pair (clock pin, data output pin), the timing analysis tools evaluate the I/O path delays through the memory. These values depend on the internal timing characteristics of the tiling netlist, such as:

1) Interconnection delays of the tiling netlist wires;
2) I/O path delay values of the tiling netlist cells;
3) Setup/hold times of the tiling netlist cells; and
4) Ramptimes of the tiling netlist wires.

The magnitudes of these values depend on input ramptimes and output loads of the tiling netlist for the mapped customer memory. Usually, some set $\{R1<R2<\ldots<Rn\}$ of input ramptimes and some set of output loads $\{L1<L2<\ldots<Lm\}$ are considered, where n and m are positive integer variables greater than one. The I/O path delays and wire interconnection delays (delay arcs) within the tiling netlist are calculated for any pair $(R_i, L_j)$ of input time $R_i$ and output load $L_j$. The setup and hold times are usually evaluated for any pair $(R_i, R_j)$ of data input ramptime $R_i$, and clock input ramptime $R_j$. The traditional approach to generating the timing characteristics for a characterization memory is to consider all (n*m) cases separately.

Thus, the process of evaluating the timing characteristics for different mappings of customer memories to each RRAM on the given slice for each of the (n*m) cases of input ramptime and output load can involve a very large amount of data and can consume a large amount of processing time.

The generation of timing models becomes even more complicated when customer memories are mapped to memory resources on the slice that have built-in self-correction, such as RRAMs. Redundant features within an RRAM that implements self-correction can make data input pins and data output pins depend on multiple clock pins.

b. Considering Less than (n*m) Cases of Input Ramptimes/ Output Loads

One embodiment of the present invention provides a method of generating timing characteristics for a customer memory without having to consider all of the (n*m) cases of input ramptimes and output loads. The timing characteristics for some of the (n*m) cases are pre-evaluated, and others are estimated. This significantly speeds the time required to generate a timing database from which the timing characteristics can be derived. Once a total timing database has been generated for the different mappings of customer memories to each RRAM on the given slice for each of the (n*m) cases of input ramptimes and output loads, a timing model can be assigned quickly and easily to a given customer memory that has been mapped to a given RRAM.

The following sections describe methods and apparatus for:

1) Estimating timing characteristics of a given tiling netlist while considering a small number of cases;
2) Preparation of an overall "total timing database" for different mappings of customer memories to different RRAMS on a given slice using the method described in 1), for example; and
3) Generating a timing model for a given customer memory using the database generated in 2).

In an embodiment of the present invention, the total timing database includes timing characteristics for each of the different mappings of the customer memory to a each RRAM on the given slice. Each mapping is referred to as a "characterization memory", and each set of different mappings of a given customer memory to a given RRAM on the slice is referred to as a memory "characterization set".

The method of estimating the timing characteristics in step 1) is performed for each characterization memory of each characterization set. However, the method can be limited to any subset in alternative embodiments of the present invention.

Once the total timing database has been created, and the customer memory is mapped to a given RRAM on the slice, the timing characteristics of the "characterization memory" that most closely matches the given mapping of the customer memory to the RRAM instance are used to form the timing model of the customer memory. Each of these steps are described in more detail below.

4. Generating Timing Characteristics for one Characterization Memory (One Tiling Netlist)

Figure 2:
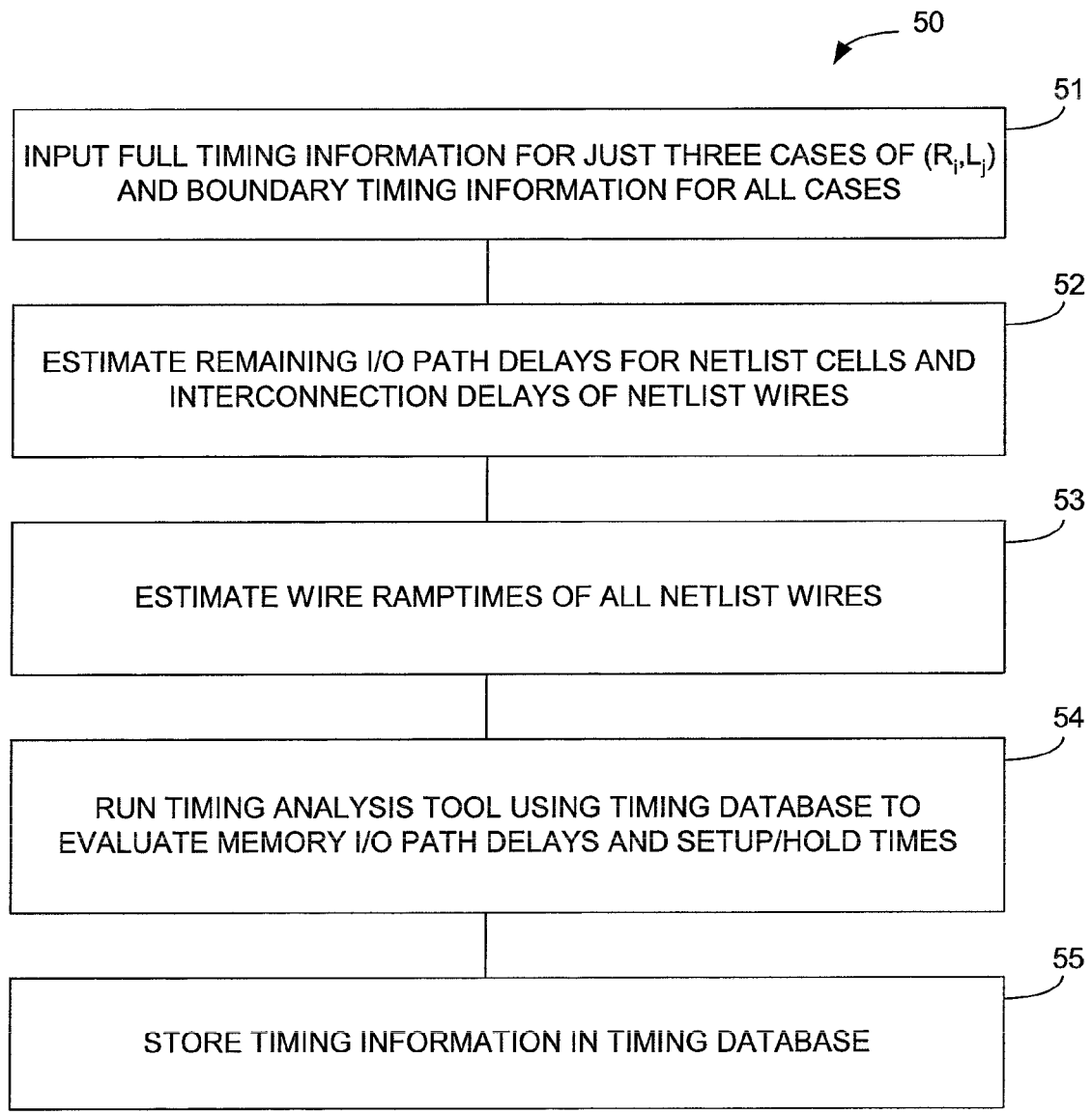
FIG. 2 is a flow chart, which illustrates a method of generating timing characteristics for a characterization memory of a given RRAM.

FIG. 2 illustrates a method 50 of generating the timing characteristics for one characterization memory of a given RRAM. The characterization memory corresponds to one mapping variant of a given customer memory to the given RRAM on the slice.

The steps shown in FIG. 2 can be performed by a Timing Estimator Algorithm executed by the semiconductor manufacturer or slice developer, for example. The Timing Estimator Algorithm can be implemented with other algorithms within a single design tool or as parts of separate tools operating together or independently.

As described below, an external timing analysis tool evaluates the timing characteristics for a limited number of input ramptime and output loads. Based on these characteristics, the Timing Estimator estimates the timing characteristics for the remaining cases.

a. Input Limited Timing Information

At step 51, the Timing Estimator receives or "inputs" a partial timing database for the particular "characterization memory" under consideration.

The external timing analysis tool generates the partial timing database by evaluating the timing characteristics for a limited number of the (n*m) cases of input ramptimes and output loads for each characterization memory of each RRAM on the slice. Any limited number of pre-evaluated cases (that is less than n*m) can be evaluated in alternative embodiments. These timing characteristics are then stored to form the partial timing database for the slice.

In one embodiment, the external timing analysis tool pre-evaluates the following data for each characterization memory for three pairs of input ramptimes and output loads:

1) Interconnection delays of the tiling netlist wires;
   2) I/O path delay values of the tiling netlist cells;
   3) Setup/hold times of the tiling netlist cells;
   4) Ramptimes of the tiling netlist wires.

The Timing Estimator does not require input data from the external tool for each pair of ramptime and output load ($R_i$, $L_j$). Rather, the Timing Estimator receives the above input data for three pairs only: ($R_1$, $L_{m/2}$), ($R_{n/2}$, $L_{m/2}$), ($R_n$, $L_{m/2}$), where $R_1$ represents the lowest input ramptime in the set $\{R1<R2<\ldots<Rn\}$, $R_{n/2}$ represents the median input ramptime in the set, and $L_{m/2}$ represents the median output load in the set $\{L1<L2<\ldots<Lm\}$. Other pairs can be used in alternative embodiments, such as ($R_{n/2}$, $L_1$), ($R_{n/2}$, $L_{m/2}$), ($R_{n/2}$, $L_m$). Also other intermediate values between the endpoints of the sets can be used in replace of $R_{n/2}$ and $L_{m/2}$, which are not necessarily at the median of the set.

In addition to the full timing information for the three limited cases, the external tool also evaluates and stores "boundary information" for all (n*m) cases of input ramptimes and output loads. The boundary information includes timing data (items 1-4 in the above-list) for cells in the tiling netlist of the characterization memory that are connected to an input or an output of the tiling netlist. Cells that have one or more input pins connected to inputs of the tiling netlist are called "input boundary cells", cells that have one or more output pins connected to outputs of the tiling netlist are called "boundary cells." Usually, a tiling netlist does not contain any cells whose pins are connected to both inputs and outputs of the netlist.

Figure 3:
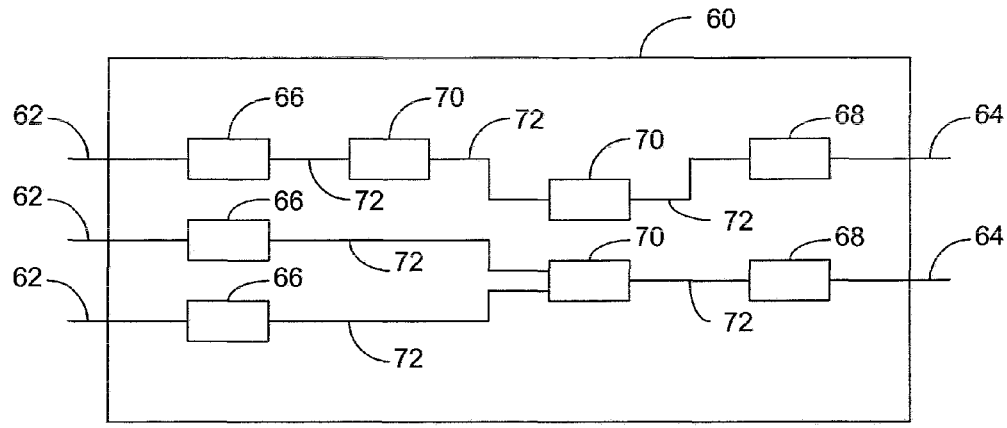
FIG. 3 is a diagram illustrating boundary and non-boundary cells of a memory tiling netlist.

FIG. 3 is a simplified diagram, which schematically illustrates a few cells of a characterization memory or other functional block for which timing characteristics can be evaluated by the external tool. The tiling netlist includes a list of all cells of memory 60, a list of interconnections between those cells and a list of input and outputs of memory 60. In this example, memory 60 has one or more inputs 62, outputs 64, input boundary cells 66, output boundary cells 68, internal cells 70 and netlist wires 72. The input boundary cells 66 have one or more pins that are connected to an input of memory 60, and the output boundary cells 68 have one or more pins that are connected to an output of memory 60. Internal cells 70 do not have any pins that are connected to an input or an output of memory 60.

Thus, the external timing analysis tool pre-evaluates the above-timing characteristics for all of the (n*m) cases of input ramptimes and output loads for or each pin of boundary cells 66 and 68 (the "boundary information"), and evaluates the timing characteristics for the remaining netlist cells and nets for only the three pre-defined cases of ($R_i$, $L_j$).

b. Estimate I/O Path and Interconnect Delays

After inputting the full timing characteristics for the boundary cells and the limited timing characteristics (for the three cases) for the non-boundary cells, the Timing Estimator estimates the timing characteristics for the remaining cases of ($R_i$, $L_j$) for the non-boundary cells.

Referring back to FIG. 2, at step 52, the Timing Estimator estimates the I/O path delays for all output pins of all non-boundary cells of the tiling netlist and estimates the interconnection delays of all wires of the tiling netlist for all cases of input ramptimes and output loads ($R_i$, $L_j$), except for the three known predefined cases ($R_1$, $L_{m/2}$), ($R_{n/2}$, $L_{m/2}$), ($R_n$, $L_{m/1}$). These estimations can be performed in three substeps:

Substep 1. For each i, where $1 \leq i < n/2$: Make a linear approximation of the corresponding delay:

$$\text{delay}(R_i, L_{m/2}) = ((R_{n/2} - R_i) * \text{delay}(R_{n/2}, L_{m/2}) + (R_i - R_1) * \text{delay}(R_1, L_{m/2})) / (R_{n/2} - R_1). \quad \text{(Eq. 1)}$$

Substep 2. For each i, where $n/2 < i \leq n$: Make a linear approximation of the corresponding delay:

$$\text{delay}(R_i, L_{m/2}) = ((R_n - R_i) * \text{delay}(R_{n/2}, L_{m/2}) + (R_i - R_{n/2}) * \text{delay}(R_{n/2}, L_{m/2})) / (R_n - R_{n/2}). \quad \text{(Eq. 2)}$$

Substep 3. For each j, except j=m/2, for each i=1, 2, ..., n, assign:

$$\text{delay}(R_i, L_j) = \text{delay}(R_i, L_{m/2}). \quad \text{(Eq. 3)}$$

c. Estimate Wire Ramptimes

At step 53, the Timing Estimator estimates the ramptimes of all wires of the netlist for all cases of input ramptimes and output loads ($R_i$, $L_j$), except for the three known, pre-defined cases ($R_1$, $L_{m/2}$), ($R_{n/2}$, $L_{m/2}$) and ($R_n$, $L_{m/2}$). The estimation can be performed in two substeps:

Substep 1. For each boundary cell, determine the ramptime of the wires that are connected to output pins of these cells because the partial timing database contains full timing characteristics of these cells for all (n*m) cases of $(R_i, L_j)$.

Substep 2. For each wire that is connected to an output of non-boundary cell, make a linear approximation of the ramptime using the same formulas that were applied in step 52 for approximating cell IO path delays and interconnection delays.

At the end of step 53, the Timing Estimator has generated and stored the I/O path delays of all netlist cells, the interconnection delays and ramptimes of all netlist wires for all cases of $(R_i, L_j)$. The setup and hold times for inputs to the netlist cells (that depend on a clock pin) can also be linearly approximated like the I/O path delays and the ramptimes. Usually, these values do not depend on the case $(R_i, L_j)$, so that after approximation, they remain constant in all (m*n) cases.

d. Evaluate Timing for Tiling Netlist Inputs and Outputs

At step 54, a further timing analysis tool evaluates the following timing characteristics using the timing database generated above for the internal components of the tiling netlist:

1) Delay values of all input-output (IO) paths of the tiling netlist that start on an input and finish on an output of the tiling netlist for any case $(R_i, L_j)$; and
2) Setup/hold times for all pairs (data input, clock input) of the tiling netlist for any case $(R_i, R_j)$.

At step 55, the resulting data is stored in the timing database for the characterization memory currently under consideration.

In one embodiment, these values are evaluated by an algorithm disclosed in U.S. patent application Ser. No. 11/205,365, filed Aug. 17, 2005 and entitled "MULTIMODE DELAY ANALYZER." This algorithm is adapted to evaluate timing of the tiling netlist for cases in which the RRAM has built-in self-correction components. However other timing analysis algorithms can be used in other embodiments. The algorithm can be incorporated with the Timing Estimator in a common Timing Analyzer or executed as a separate tool.

With the method described in FIG. 2, the Timing Estimator inputs full timing information for all (n*m) cases of input ramptimes and output loads $(R_i, L_j)$ for the boundary cells only. For all non-boundary cells, the Timing Estimator inputs timing information only for three cases of $(R_i, L_j)$.

Since full timing information is not required on all cells for all cases of input ramptimes and output loads, the run time of the tools to generate a complete timing database for each characterization memory of each RRAM on a slice is significantly reduced. Also, the external tools that provide the Timing Estimator with the input data needs to be run only for the three cases instead of the (n*m) cases for most cells in the tiling netlist.

5. Creating the Timing Database for all Characterization Memories

This section describes the construction of the overall timing database for all RRAMs on a given base platform slice.

Figure 4:
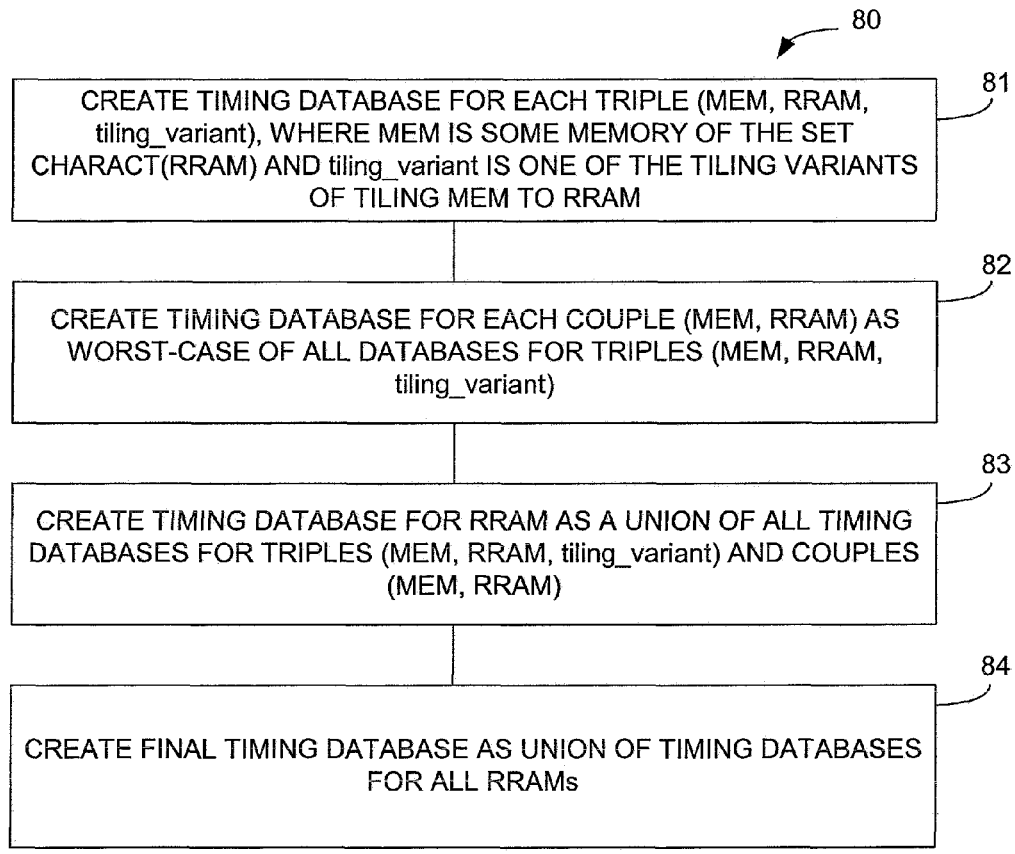
FIG. 4 is a flow chart illustrating a timing database creation algorithm.

FIG. 4 is a flowchart illustrating a method 80 of generating the timing database according to one embodiment of the present invention.

For any given customer memory MEM, each RRAM has a finite number of different variants of tiling that can be met when the customer memory MEM is mapped to that RRAM. The process of constructing the timing database for the given memory MEM and the given RRAM includes examining all possible variants of timing this memory to the RRAM, at step 81. For each tiling variant, the Timing Estimator generates the timing characteristics for the corresponding tiling netlist according to the method described above with respect to FIG. 2. These timing characteristics are stored in a database called "timing database for triple (MEM, RRAM, tiling_variant)", where MEM refers to the particular customer memory, RRAM refers to the particular RRAM to which MEM is mapped, and tiling_variant refers to the particular tiling variant of MEM within RRAM.

After the timing databases have been built for the triple (MEM, RRAM, tiling_variant) for all possible tiling variants, at step 81, the Timing Estimator creates a database, at step 82, called "timing database for couple (MEM, RRAM)" that stores the worst values of the delay arcs and setup/hold times among all possible tiling variants in the timing database for triple (MEM, RRAM, tiling_variant).

As mentioned above, for any RRAM, a set of characterization memories CHARACT(RRAM)=(MEM1, MEM2, . . . MEMn) called a "characterization set" can be created. This set includes memories having different parameters (number of bits and number of words) and the set is constructed so that tiling netlists built for all variants of tiling of the characterization memories "cover" any possible variant mapping of any customer memory. The term "cover" means that one tiling netlist contains another one tiling netlist as a sub netlist.

The Timing Estimator examines memories from this characterization set and constructs databases for the triples ($MEM_i$, RRAM, tiling_variant) and couples ($MEM_i$, RRAM) of the set CHARACT(RRAM), at steps 81 and 82.

At step 83, the "timing database for the given RRAM" is obtained as a union of the databases for the triples (MEM, RRAM, tiling_variant) and couples (MEM, RRAM), where MEM is a memory from the set CHARACT(RRAM). At step 84, the final timing database is the union of all timing databases for all RRAMs that are available on the base platform slice.

Once the final timing database has been created in FIG. 4, the timing database may be provided to the customer with a Memory Timing Model Generator tool for generating timing models for customer memories using the timing database. Alternatively, one or more parts of the Timing Estimator can be executed by the customer as part of the design tools supplied by the slice developer or as separate tools or algorithms.

6. Generating Memory Timing Models

The Memory Timing Model Generator executes an algorithm, which generates a timing model for customer memories that are mapped to a given base platform slice.

These models can then be used by subsequent design tools for assisting the customer in a variety of tasks, such as further placement, layout, routing, design verification, etc.

In one embodiment, at least some of these design tools use the following two types of memory timing models for memories mapped to RRAM locations:

1) Timing models of the given case of the mapping of memory M to the given RRAM of the slice; and
2) Memory timing models of the worst case of mapping memory M to any RRAM of the give slice.

Let us consider some memory M with capacity (number of words) C and width (number of bits per word) W. In one embodiment, the Memory Timing Model Generator algorithm compares the customer memory M with the set of characterization memories of the given RRAM. The algorithm identifies the closest memory of this set of characterization memories to the customer memory M. The timing characteristics of this characterization memory are then assigned to the timing model of the customer memory M.

The closest characterization memory can be identified by any suitable method. According to one embodiment, the memory MEM of the set of characterization memories for the given RRAM to which the customer memory M is mapped is "the closest memory to the customer memory M" if and only if capacity (MEM)≧C and any memory MEM2 of this characterization set satisfies the three following conditions:

1) capacity(MEM2)<C or capacity(MEM2)≧capacity (MEM);
2) width(MEM2)≦width(MEM), if width(MEM)<W; and
3) width(MEM)≦width(MEM2) or width(MEM2)<W, if width(MEM)≧W.

Figure 5:
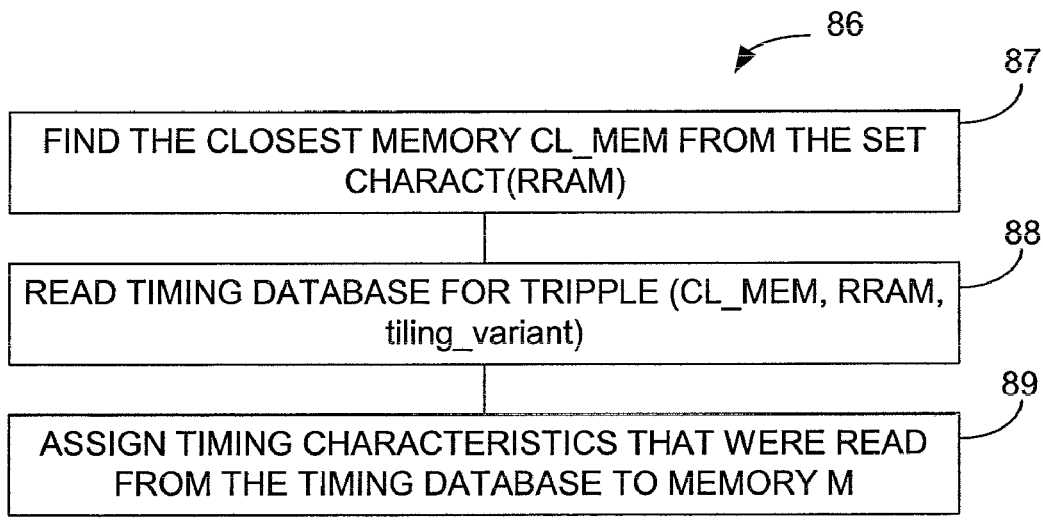
FIG. 5 is a flow chart illustrating a timing model generation algorithm.

FIG. 5 is a flowchart illustrating a process 86 of generating timing models for a given case of mapping customer memory M to a particular RRAM on the slice with a known variant of tiling. At step 87, the Timing Model Generator searches the timing database to find the closest memory CL_MEM from the memory characterization set CHARACT(RRAM) of the given RRAM using the above-criteria. At step 88, the Timing Model Generator reads the timing database for the triple (CL_MEM, RRAM, tiling_variant) from the total timing database and, at step 89, assigns the timing characteristics that were read from the timing database in step 112 to the customer memory M. These timing characteristics therefore become the timing model of the customer memory M for the given mapping to the given RRAM of the slice.

Figure 6:
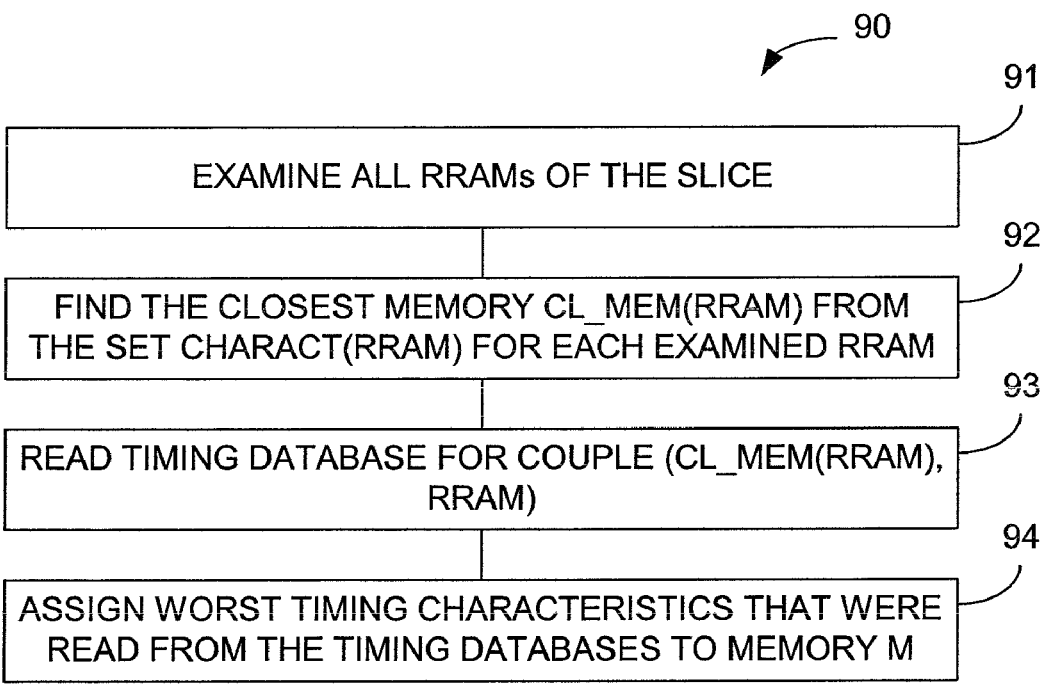
FIG. 6 is a flow chart illustrating a worst-case timing model generation algorithm.

FIG. 6 is a flowchart of a process 90 for generating the worst case memory timing models for the customer memory M. At step 91, the Timing Model Generator examines all RRAMs of the slice. At step 92, the algorithm fines the closest memory CL_MEM(RRAM) to the customer memory M from the characterization set CHARACT(RRAM) for each examined RRAM using the above-criteria. At step 93, the algorithm reads the timing database (timing characteristics) for the couple (CL_MEM(RRAM),RRAM) These characteristics represent the worst case of mapping the closest memory CL_MEM to the given RRAM. At step 94 the algorithm assigns the worst timing characteristics that were read from the timing databases in step 93 to customer memory M. These worst case timing characteristics form the worst case timing model for customer memory M.

The worst case timing model and the timing model for the particular mapping of the customer memory to a particular RRAM can then be used by subsequent design tools for completing the customer design.

The timing estimator and timing model generation algorithms discussed above therefore provide a method and apparatus for quickly generating memory timing models based on the following concepts:

1) Estimating timing characteristics of a given memory tiling netlist while considering as small of a number of cases as possible;
2) Preparing a timing database for each of the different characterization memories; and
3) Using this timing database to generate the timing models for any given customer memory.

These methods do not require that the customer run expensive timing analysis tools, and the customer is not required to process lengthy timing evaluations. Rather, the timing analyzer disclosed above stores delay arc values and setup/hold times that are pre-evaluated for the different characterization memories. These delay arc values and setup/hold times are stored in timing databases that are can be provided by the semiconductor manufacturer with the tools that are responsible for timing model generation.

7. Exemplary Computing Environment

Figure 7:
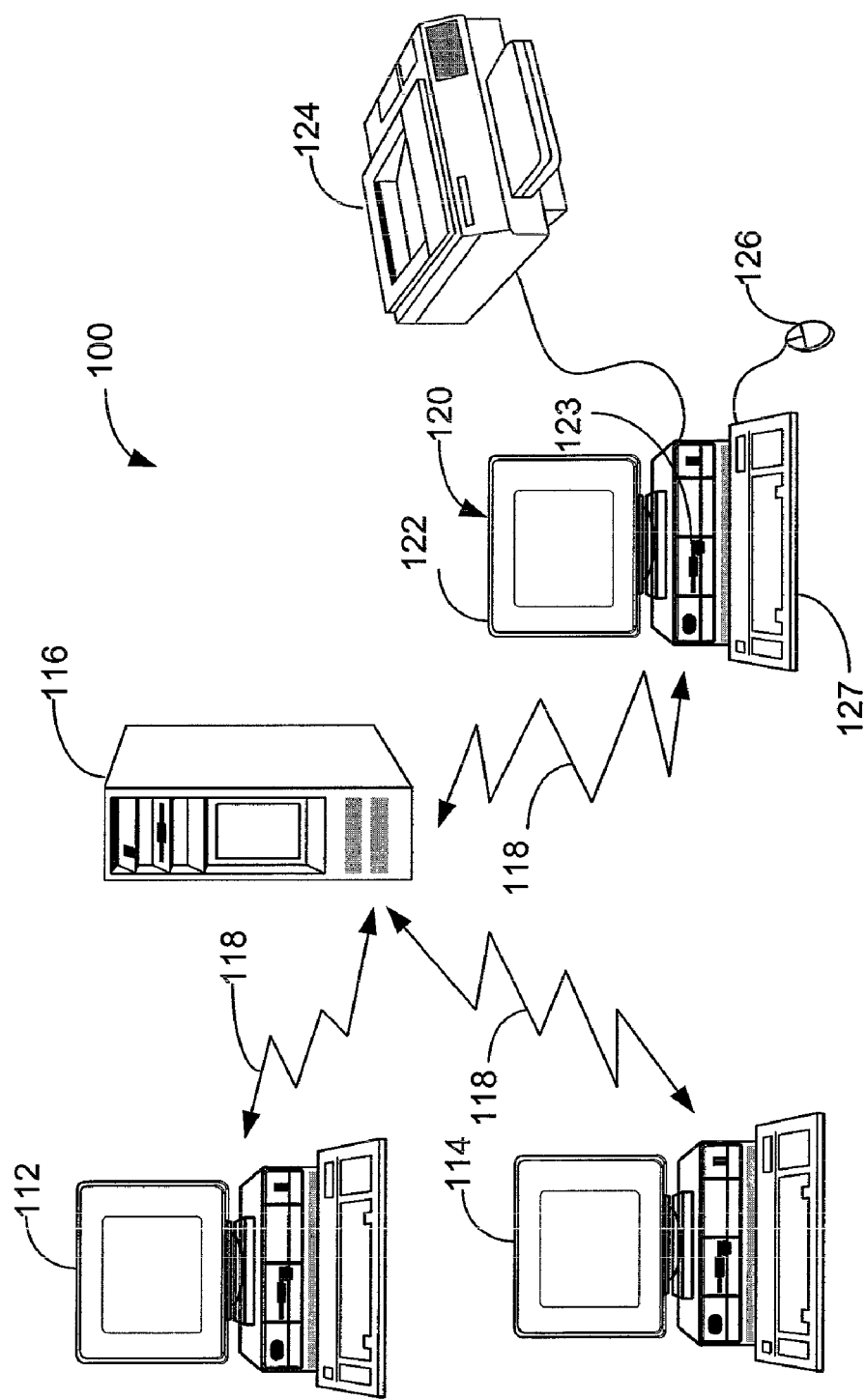
FIG. 7 illustrates an exemplary computer system upon which one or more design tools for implementing an embodiment of the present invention could be installed or used.

FIG. 7 illustrates an exemplary computer system 100 upon which one or more of the algorithms, tools or tool components discussed above could be installed or used.

Computer system 100 is illustrated as a networked computer system that includes one or more client computers 112, 114 and 120 such as workstations coupled through a network 118 to a server 116. Server 116 could also be a personal computer, a workstation, a midrange computer, or a mainframe computer. Network 118 represents any type of networked interconnection including but not limited to local-area, wide-area, wireless, and public networks such as the Internet or an Intranet.

Computer 120 may represent practically any type of computer, computer system, or other programmable electronic device, including a client computer similar to computers 112, 114 and 120 of FIG. 7, a server computer, e.g., similar to server 116 of FIG. 7, a portable computer, an embedded controller, a hand-held device, etc. Computer 120 may be coupled in a network as shown in FIG. 7 or may be a stand-alone device.

Computer 120 typically receives a number of inputs and outputs for communicating information externally. For interface with a user or operator, computer 120 typically includes one or more user input devices 126, 127, e.g., a keyboard, a mouse, a trackball, a joystick, a touchpad, and/or a microphone, among others, and a display 122 such as a CRT monitor, an LCD display panel, and/or a speaker, among others. For additional storage, computer 120 may also include one or more storage devices 123, e.g., a floppy or other removable disk drive, a hard disk drive, a direct access storage device, an optical drive, e.g., a CD drive, a DVD drive, etc., and/or a tape drive, among other computer-readable mediums, that may be connected directly or may be connected through a storage area network (SAN) or other network. Furthermore, computer 120 may include an interface connected to one or more networks 118, e.g., a local-area network, a wide-area network, a wireless network, and/or the Internet, among others, to permit communication of information with other computers coupled to the network.

Figure 8:
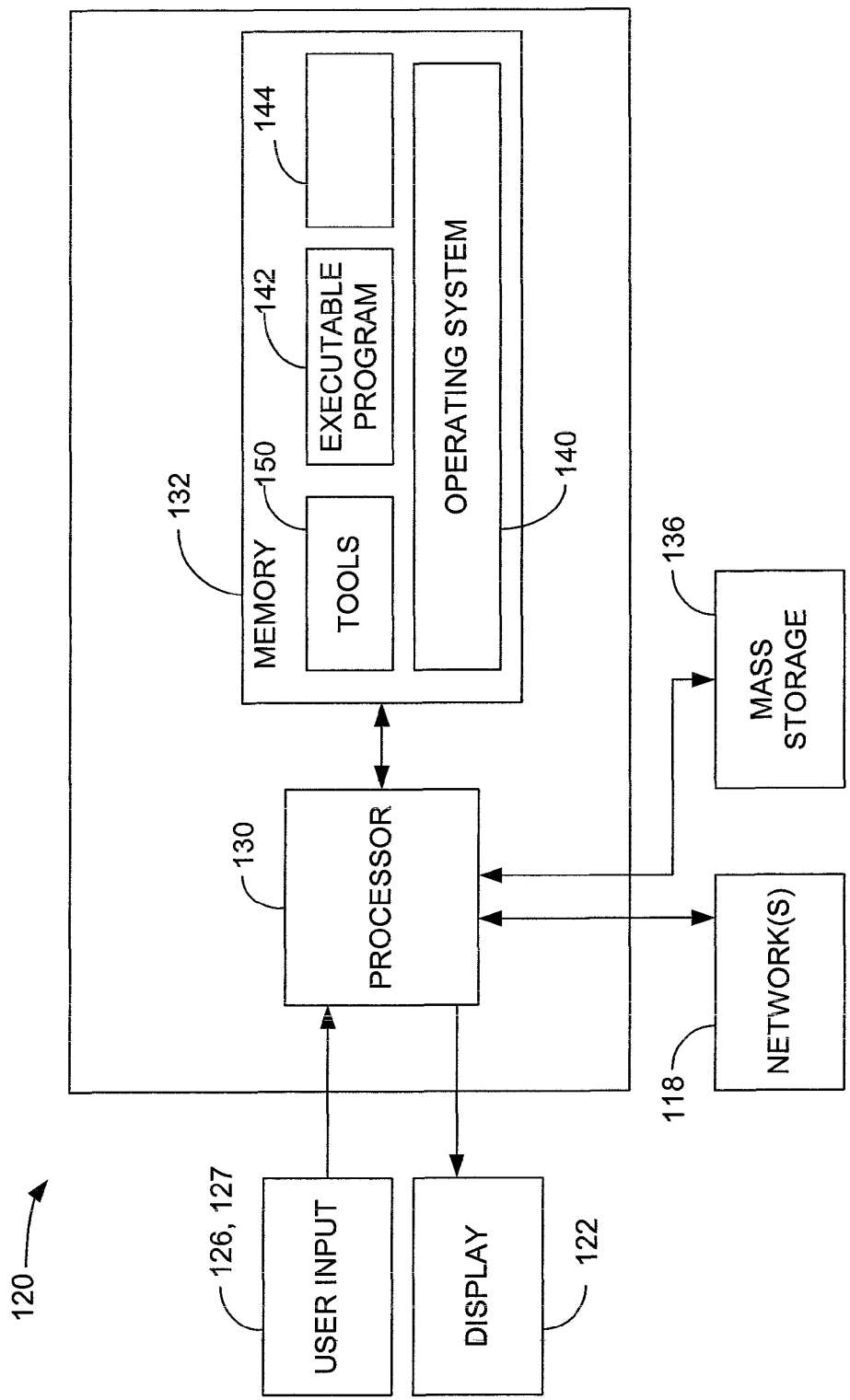
FIG. 8 is a block diagram of a computer upon which the methods and apparatus of various embodiments of the present invention can be installed, fully or partly, as one or more applications.

FIG. 8 is a block diagram of computer 120 upon which the methods and apparatus of various embodiments of the present invention can be installed, fully or partly, as one or more applications.

Computer 120 typically includes at least one processor 130 coupled to a memory 132. Processor 130 may represent one or more processors or microprocessors and memory 132 may represent the random access memory (RAM) devices comprising the main storage of computer 130, as well as any supplemental levels of memory such as cache memories, nonvolatile or backup memories, programmable or flash memories, read-only memories, etc. In addition, memory 132 may be considered to include memory storage physically located elsewhere in computer 130, e.g., any storage capacity used as a virtual memory, e.g., as stored on a mass storage device 36 coupled to computer 120 with a SAN or on another computer coupled to computer 120 via network 18.

Computer 120 may operate under the control of any suitable operating system 140. Operating system 140 typically executes various computer software applications, components, programs, objects, modules, etc., such as an executable program 142 and/or other components 144. Although the design tools 150 used to implement one or more embodiments of the present invention may be in memory 132 for the purpose of developing an integrated circuit, they need not be. The processor 130 may access the tools, the required data, other various applications components, programs, objects, modules, etc., resident on one or more processors in another computer coupled to computer 120 via a network 118, e.g., in a distributed or client-server computing environment whereby the processing to implement the functions of the memory allocation tool may be allocated to multiple computers over a network.

In general, the various tools 150 executed to implement one or more of the embodiments of the invention are referred to as design tools, whether implemented as part of an operating system or a specific application, database, component, program, object, module or sequence of instructions. The design tools typically comprise one or more instructions or databases that are resident at various times in various memory and storage devices in a computer, and that, when read and executed by one or more processors in a computer network, cause that computer to perform the instructions and/or process the databases embodying the various aspects of the invention. Examples of computer readable media on which such instructions can be stored include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. The exemplary environments illustrated in FIGS. 7 and 8 are not intended to limit the present invention.

Although the present invention has been described with reference to preferred embodiments, workers skilled in the art will recognize that changes may be made in form and detail without departing from the scope of the invention. For example, the Timing Estimator can be used to generate a timing database and timing models for any functional block of an integrated circuit, such as a memory matrix or a non-memory megacell. In one embodiment, the methods and apparatus discussed above are applicable to generate a timing database and timing models for any reconfigurable functional block.

What is claimed is:
1. A method comprising:
   (a) defining a plurality of characterization memories, each characterization memory having different memory parameters;
   (b) defining by a computer a plurality of variants of tiling each characterization memory to a memory resource on an integrated circuit, each variant of tiling each characterization memory to the memory resource being referred to as a tiling netlist; and
   (c) storing with the computer, on a computer readable medium, timing characteristics for each tiling netlist for the memory resource, wherein the timing characteristics comprise, for each tiling netlist:
      evaluated timing characteristics corresponding to a first subset of combinations of input ramptimes and output loads of the tiling netlist; and
      estimated timing characteristics corresponding to a second, different subset of combinations of input ramptimes and output loads of the tiling netlist, which are mathematical functions of at least one or more of the timing characteristics for the first subset.
2. The method of claim 1 wherein step (c) comprises, for each tiling variant of each characterization memory, storing setup and hold times for inputs to the characterization memory and storing input-output path delays for the characterization memory.
3. The method of claim 1 wherein the memory resource comprises a reconfigurable random access memory (RRAM).
4. The method of claim 3 and further comprising:
   (d) performing steps (a) through (c) for each RRAM on a base platform slice; and
   (e) forming an overall timing database as a union of the memory timing databases of all RRAMs on the base platform slice.
5. The method of claim 1 and further comprising:
   (d) creating a worst-case timing database for each characterization memory of the memory resource by storing the worst values from the memory timing database of the timing characteristics for the tiling variants of the characterization memory.
6. The method of claim 1 wherein the different memory parameters comprise different combinations of capacity and width.
7. The method of claim 1 step (c) comprises, for each of the tiling variants:
   (c)(1) evaluating the timing characteristics of the respective characterization memory for the first subset of the input ramptimes and output loads; and
   (c)(2) estimating the timing characteristics for the second, different subset of the input ramptimes and output loads, not evaluated in (c)(1), based on mathematical functions of at least one of the timing characteristics for the first subset.
8. The method of claim 7 wherein step (c)(1) comprises evaluating interconnection delays of netlist wires in the characterization memory, input-output path delays of netlist cells in the characterization memory, and ramptimes of the netlist wires.
9. The method of claim 7 wherein step (c)(2) comprises:
   evaluating the timing characteristics of non-boundary cells in the respective characterization memory for the first subset of the input ramptimes and output loads; and
   evaluating the timing characteristics of boundary cells of the respective characterization memory for all combinations of the input ramptimes and output loads in the set.
10. The method of claim 7 wherein:
    the set comprises a set $\{R1<R2<\ldots<Rn\}$ of input ramptimes and a set $\{L1<L2<\ldots<Lm\}$ of output loads, where n and m are positive integer variables greater than one;
    step (c)(1) comprises, for non-boundary cells in the characterization memory, evaluating the timing characteristics only for pairs $(R_1, L_{m/2})$, $(R_{n/2}, L_{m/2})$, and $(R_n, L_{m/2})$ of input ramptimes and output loads; and
    step (c)(2) comprises, for the non-boundary cells, estimating the timing characteristics for other pairs $(R_i, L_j)$ of input ramptimes and output loads, for i=1 to n and for j=1 to m, based on at least one of the timing characteristics evaluated in (c)(1).
11. The method of claim 10, wherein estimating the timing characteristics comprises making linear approximations of at least some of the timing characteristics.

* * * * *